(12) United States Patent
Liu et al.

(10) Patent No.: US 11,581,123 B2
(45) Date of Patent: Feb. 14, 2023

(54) INDUCTOR AND CIRCUIT STRUCTURE AND METHOD OF MANUFACTURING THE SAME

(71) Applicant: Advanced Semiconductor Engineering, Inc., Kaohsiung (TW)

(72) Inventors: Syu-Tang Liu, Kaohsiung (TW); Huang-Hsien Chang, Kaohsiung (TW); Yunghsun Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 390 days.

(21) Appl. No.: 16/937,498

(22) Filed: Jul. 23, 2020

(65) Prior Publication Data

US 2022/0028596 A1    Jan. 27, 2022

(51) Int. Cl.
| | | |
|---|---|---|
| *H01F 27/28* | (2006.01) | |
| *H01F 27/24* | (2006.01) | |
| *H01F 27/32* | (2006.01) | |
| *H01F 27/40* | (2006.01) | |
| *H05K 3/30* | (2006.01) | |
| *H05K 3/46* | (2006.01) | |
| *H01F 41/04* | (2006.01) | |
| *H05K 1/18* | (2006.01) | |

(52) U.S. Cl.
CPC ......... *H01F 27/2804* (2013.01); *H01F 27/24* (2013.01); *H01F 27/324* (2013.01); *H01F 27/40* (2013.01); *H01F 41/041* (2013.01); *H05K 1/18* (2013.01); *H05K 3/30* (2013.01); *H05K 3/46* (2013.01); *H05K 2201/1003* (2013.01); *H05K 2201/10015* (2013.01)

(58) Field of Classification Search
CPC .......... H05K 1/18; H05K 2201/10015; H05K 2201/1003; H05K 1/162; H05K 1/165; H01F 27/2804
See application file for complete search history.

(56) References Cited

U.S. PATENT DOCUMENTS

| | | | | |
|---|---|---|---|---|
| 3,603,902 | A * | 9/1971 | Denes | H03H 1/0007 333/182 |
| 2015/0108621 | A1* | 4/2015 | Pabst | H01L 24/96 257/659 |
| 2019/0304923 | A1* | 10/2019 | Shekhar | H01F 17/0013 |
| 2022/0013444 | A1* | 1/2022 | Kim | H01L 23/49822 |

\* cited by examiner

*Primary Examiner* — Sherman Ng
(74) *Attorney, Agent, or Firm* — Foley & Lardner LLP

(57) ABSTRACT

An inductor unit includes a conductive structure, a first magnetic element and an insulating layer. The conductive structure has a bottom conductive layer, a top conductive layer, and a first side conductive layer extending from the bottom conductive layer to the top conductive layer. The first magnetic element is disposed on the bottom conductive layer of the conductive structure. The insulating layer is disposed on the bottom conductive layer of the conductive structure, wherein the insulating layer covers and surrounds the first magnetic element. The circuit structure including the inductor unit and the methods for manufacturing the same are also provided.

15 Claims, 19 Drawing Sheets

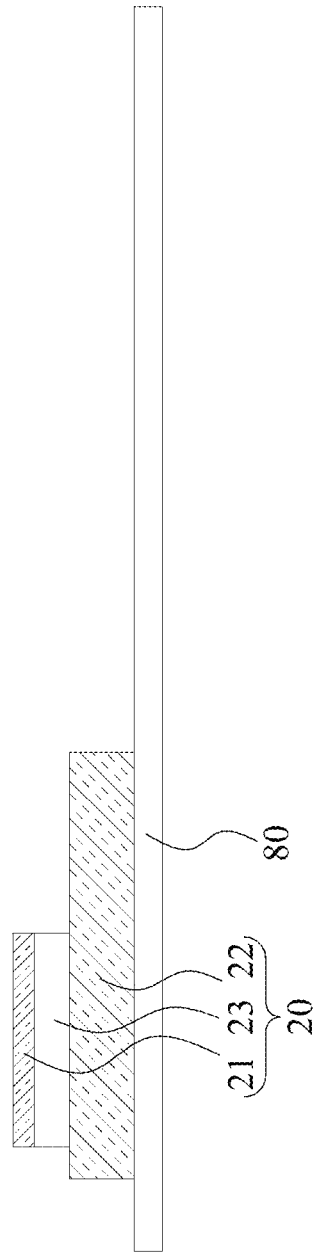

INDUCTOR AND CIRCUIT STRUCTURE AND METHOD OF MANUFACTURING THE SAME

BACKGROUND

1. Field of the Disclosure

The present disclosure relates to an inductor unit, especially for an inductor unit that can be integrated in a circuit structure.

2. Description of Related Art

As mobile communication develops, an inductor with less power loss and greater Q-factor is required. A conventional inductor, which may be in a form of conductive coil that includes two redistribution layers (RDLs) and a conductive pillar connected therebetween. In order to obtain an inductor with greater inductance, magnetic materials may be embedded in the conductive coil. However, even enhanced with magnetic materials, such conventional inductor cannot arrive at a sufficient inductance to satisfy requirement for high frequency application. In addition, process for manufacturing the conductive pillar connecting the two RDLs is complicated, and therefore the conductive pillar is prone to break and collapse during manufacturing, causing disfunctioning of the inductor and low production yield. 2.5D and/or 3D stacking technology applied in the aforesaid conventional inductor bears a high production cost. Therefore, it is desirable to design a new inductor structure in view of current technology.

SUMMARY

According to some embodiments of the present disclosure, an inductor unit includes a conductive structure, a first magnetic element and an insulating layer. The conductive structure has a bottom conductive layer, a top conductive layer, and a first side conductive layer extending from the bottom conductive layer to the top conductive layer. The first magnetic element is disposed on the bottom conductive layer of the conductive structure. The insulating layer is disposed on the bottom conductive layer of the conductive structure, wherein the insulating layer covers and surrounds the first magnetic element.

According to some embodiments of the present disclosure, a circuit structure includes a capacitor structure, a first redistribution layer, a first inductor structure, an insulating material, a second redistribution layer and a first conductive pillar. The first redistribution layer is over the capacitor structure. The first inductor structures is electrically connected to the first redistribution layer. The insulating material encloses the first redistribution layer and the first inductor unit. The second redistribution layer is over the first inductor and the capacitor structure. The first conductive pillar penetrates the insulating material and electrically connecting the first redistribution layer, the second redistribution layer and the capacitor structure.

According to some embodiments of the present disclosure, a method of manufacturing a circuit structure includes: forming a capacitor structure; forming a first redistribution layer on the capacitor structure; forming a first inductor structure on the first redistribution layer; and forming a second redistribution layer over the first inductor structure.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 9A, FIG. 9B, FIG. 9C, FIG. 9D, FIG. 9E and FIG. 9F illustrate various stages of a method for manufacturing a circuit structure in accordance with some embodiments of the present disclosure.

Figure 1:
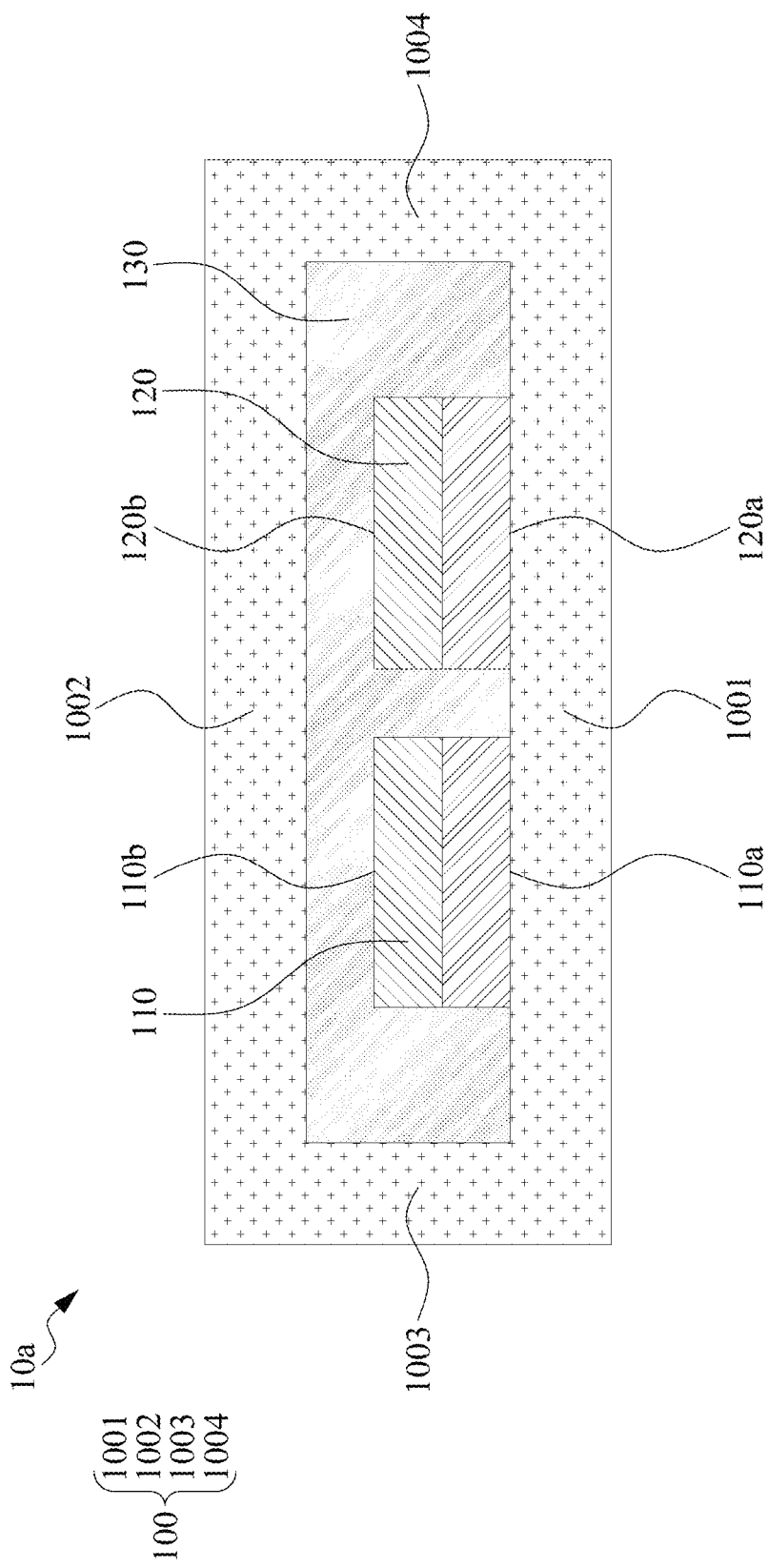
FIG. 1 is a cross-sectional view of an inductor unit in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of an inductor unit 10a in accordance with some embodiments of the present disclosure.

In some embodiments, the inductor unit 10a may include a conductive structure 100, a magnetic element 110, a magnetic element 120, and an insulating layer 130.

In some embodiments, the conductive structure 100 may include metal, metal alloy or other suitable materials. The metal may include copper (Cu), titanium (Ti), tantalum (Ta), tungsten (W), aluminum (Al), cobalt (Co), nickel (Ni), platinum (Pt), lead (Pb), molybdenum (Mo) and compounds thereof. The metal alloy may include, such as, aluminum-copper alloy (Al—Cu).

In some embodiments, the conductive structure 100 may include a conductive layer 1001, a conductive layer 1002, a conductive layer 1003, and a conductive layer 1004. The conductive layer 1001 is disposed opposite to the conductive layer 1002. The conductive layer 1003 may extend from the conductive layer 1001 to the conductive layer 1002. The conductive layer 1004 may extend from the conductive layer 1001 to the conductive layer 1002. The conductive layer 1003 is disposed opposite to the conductive layer 1004. The conductive layer 1001 may also be referred to a bottom conductive layer of the conductive structure 100. The conductive layer 1002 may also be referred to a top conductive layer of the conductive structure 100. The conductive layer 1003 may also be referred to as a first side conductive layer of the conductive structure 100. The conductive layer 1004 may also be referred to a second side conductive layer of the conductive structure 100.

In some embodiments, the magnetic element 110 may be disposed within the conductive structure 100. That is, the magnetic element 110 may be enclosed by the conductive layers 1001, 1002, 1003 and 1004. In some embodiments, the magnetic element 110 may be disposed on the conductive layer 1001 of the conductive structure 100. The magnetic element 110 may be in contact with the conductive layer 1001 of the conductive structure 100. The magnetic element 110 may be spaced apart from the conductive layer 1002 by the insulating layer 130. The magnetic element 110 may be spaced apart from the conductive layer 1003 by the insulating layer 130. In some embodiments, the magnetic element 110 may be free of enclosure from the conductive structure 100 at particular sides. For example, a front side (i.e., the side facing toward the reader) and a back side (i.e., the side facing away from the reader) of the magnetic element 110 may be free of enclosure from any of the conductive layers.

The magnetic element 110 may include a magnet. The magnetic element 110 may include a magnetic material. For example, the magnetic material may include ferromagnetic material, such as iron. The magnetic material may include metal alloy, such as Co—Zr—Ta—B (CZTB) alloy, Co—Zr—Ta (CZT) alloy, Fe—Co—Ni alloy (Kovar alloy), Fe—Ni alloy, Co—Fe—B alloy or other suitable materials.

The magnetic element 110 may include a magnetic pole 110a and a magnetic pole 110b. The magnetic pole 110a may be N or S. The magnetic pole 110b is the opposite of the magnetic pole 110a. As illustrated in FIG. 1, the portion of the magnetic element 110 proximal to the magnetic pole 110b is depicted with different pattern from the portion of the magnetic element 110 proximal to the magnetic pole 110a for the purpose of showing the polarization result. The magnetic element 110 can be a single congruent material with defined magnetic poles 110a and 110b.

The magnetic element 120 may be disposed within the conductive structure 100. In some embodiments, the magnetic element 120 may be disposed on the conductive layer 1001 of the conductive structure 100. The magnetic element 120 may be in contact with the conductive layer 1001 of the conductive structure 100. The material of the magnetic element 120 may be the same as or similar to that of the magnetic element 110. The magnetic element 120 may include a magnetic pole 120a and a magnetic pole 120b. The magnetic pole 120a may be the same as the magnetic pole 110a. The magnetic pole 120b may be different from the magnetic pole 120a.

In some embodiments, the magnetic pole 110a of the magnetic element 110 may face the conductive layer 1001 of the conductive structure 100, and the magnetic pole 120a of the magnetic element 120 may face the conductive layer 1001 of the conductive structure 100. In some embodiments, both the magnetic pole 110a of the magnetic element 110 and the magnetic pole 120a of the magnetic element 120 may be in contact with the conductive layer 1001 of the conductive structure 100.

Although FIG. 1 illustrates the inductor unit 10a includes two magnetic elements 110 and 120, the inductor unit 10a may include two or more magnetic elements, and the present disclosure is not intended to be limited thereto.

In some embodiments, the insulating layer 130 may be disposed within the conductive structure 100. In some embodiments, the insulating layer 130 may be disposed on the conductive layer 1001 of the conductive structure 100. The insulating layer 130 may cover the magnetic element 110 and the magnetic element 120. The insulating layer 130 may surround the magnetic element 110 and the magnetic element 120. The magnetic element 110 may be separated from the magnetic element 120 by the insulating layer 130. The magnetic element 110 may be spaced from the conductive layer 1002 of the conductive structure 100 by the insulating layer 130. The magnetic element 110 may be spaced from the conductive layer 1003 of the conductive structure 100 by the insulating layer 130. In some embodiments, the insulating layer 130 may include a patternable layer. For example, the patternable layer may include a photoresist material, which can be patterned by a lithography process.

In comparison with a conventional inductor, the inductor unit 10a includes a magnetic element, such as the magnetic element 110, which may assist in generating a greater magnetic flux.

Figure 2:
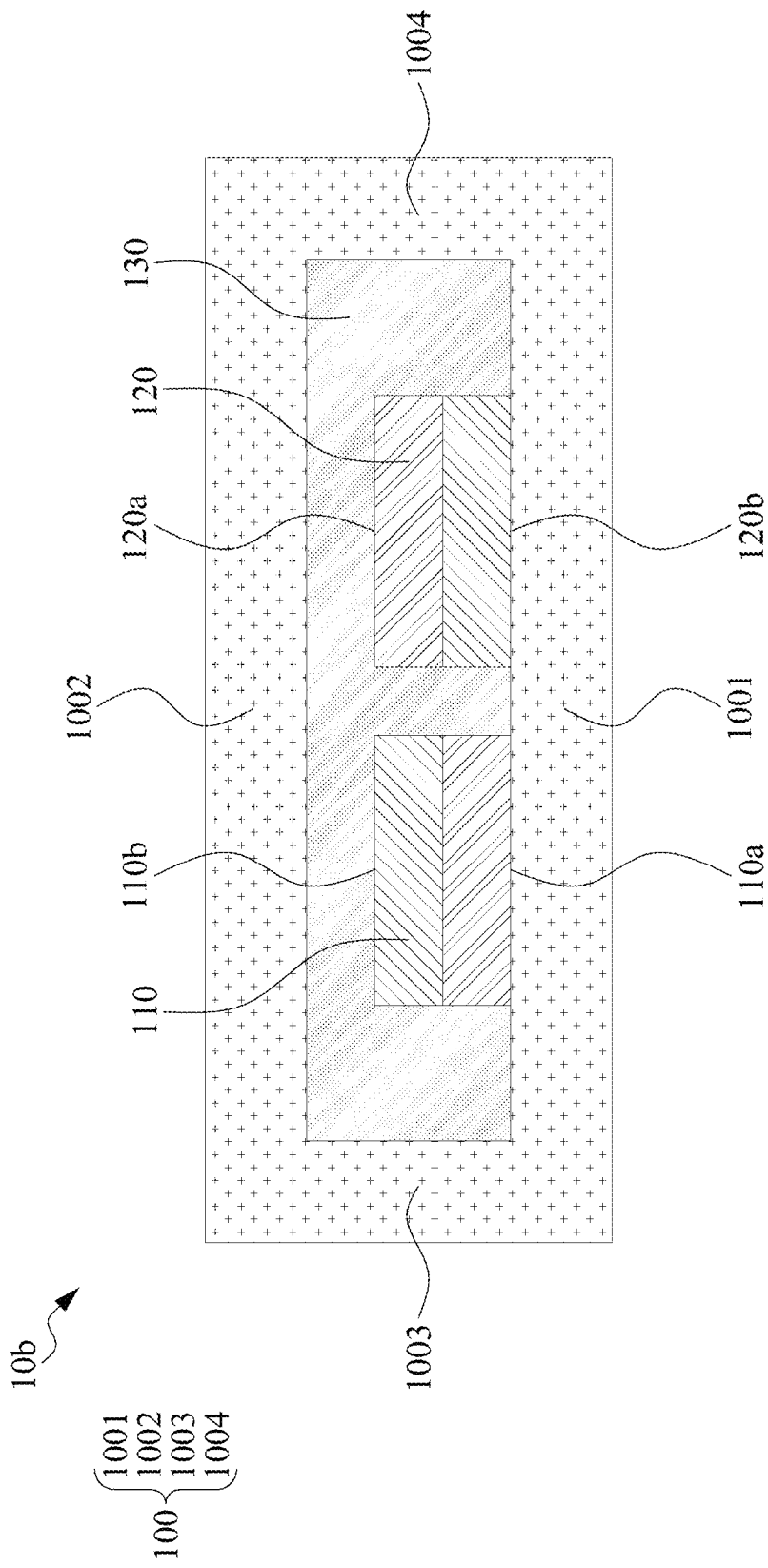
FIG. 2 is a cross-sectional view of an inductor unit in accordance with some embodiments of the present disclosure.

FIG. 2 is a cross-sectional view of an inductor unit 10b in accordance with some embodiments of the present disclosure. The inductor unit 10b of FIG. 2 has a structure similar to that of the inductor unit 10a of FIG. 1 except that the magnetic pole 120b of the magnetic element 120 faces the conductive layer 1001 instead of the conductive layer 1002.

In some embodiments, the magnetic pole 110a of the magnetic element 110 may face the conductive layer 1001 of the conductive structure 100, and the magnetic pole 120a of the magnetic element 120 may face the conductive layer 1002 of the conductive structure 100. In some embodiments, both the magnetic pole 110a of the magnetic element 110 and the magnetic pole 120b of the magnetic element 120 may be in contact with the conductive layer 1001 of the conductive structure 100.

Figure 3:
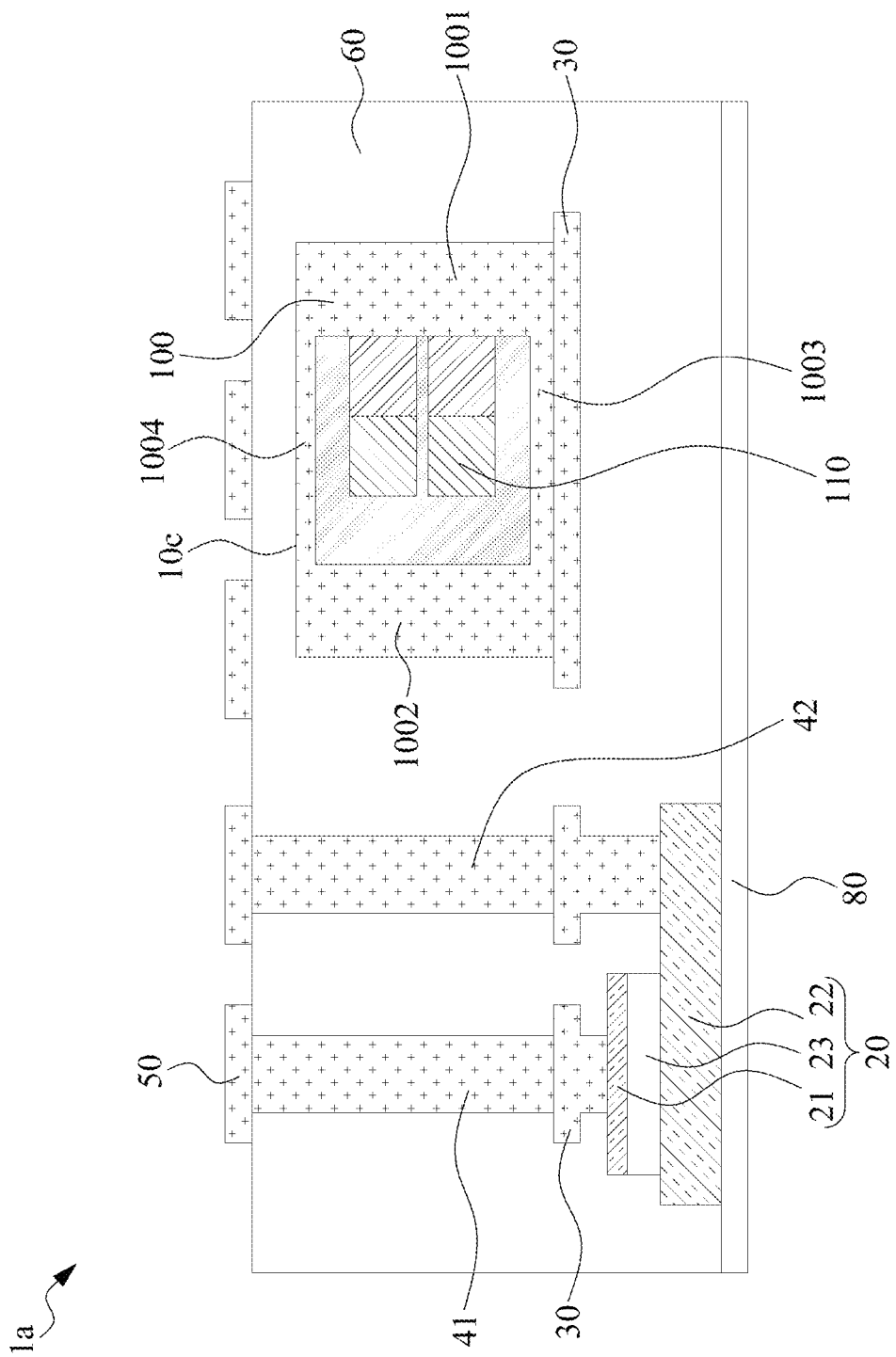
FIG. 3 is a cross-sectional view of a circuit structure in accordance with some embodiments of the present disclosure.

FIG. 3 is a cross-sectional view of a circuit structure in accordance with some embodiments of the present disclosure. In some embodiments, the circuit structure 1a may include an inductor structure 10c, a capacitor structure 20, a redistribution layer 30, a conductive pillar 41, a conductive pillar 42, a redistribution layer 50, an insulating material 60 and a carrier 80.

The carrier 80 can be a substrate supporting the illustrate components of the circuit structure 1a. The carrier 80 may include a silicon substrate, a III-V material substrate, a glass substrate, or other substrates suitable for circuit structure 1a integration.

The capacitor structure 20 may be disposed over the carrier 80. The capacitor structure 20 may include an electrode 21, an electrode 22, and a dielectric layer 23. The electrode 22 may be disposed on the carrier 80. The dielectric layer 23 may be disposed between the electrode 21 and the electrode 22. The electrode 21 and the electrode 22 may include a conductive material, such as metal, metal alloy, metal nitride, or other suitable materials. The dielectric layer 23 may include oxide, nitride, oxynitride or other suitable materials.

In some embodiments, the redistribution layer 30 may be disposed over the capacitor structure 20. The redistribution layer 30 may be electrically connected to the capacitor structure 20. The redistribution layer 30 may be patterned on a particular level of the insulating material 60, for example, as illustrated in FIG. 3, a section of the redistribution layer 30 is over the capacitor structure 20, and another section of the redistribution layer 30 is under the inductor structure 10c. The redistribution layer 30 is so patterned to electrically connect the active and passive electronic components of the circuit structure 1a. For example, a transistor structure in the carrier 80 may be electrically connected to the capacitor structure 20 and the inductor unit 1c via the redistribution layer 30. The redistribution layer 30 may include a conductive material, such as metal, metal alloy or other suitable materials. The redistribution layer 30 may include copper.

In some embodiments, the conductive pillar 41 and the conductive pillar 42 may be disposed over the redistribution layer 30. In some embodiments, the conductive pillar 41 may be electrically connected to the electrode 21 of the capacitor structure 20. In some embodiments, the conductive pillar 42 may be electrically connected to the electrode 22 of the capacitor structure 20. The conductive pillar 41 and the conductive pillar 42 may include a conductive material, such as metal, metal alloy or other suitable materials. The conductive pillar 41 and the conductive pillar 42 may be configured to electrically connect, for example, the capacitor structure 20, the redistribution layer 30 and the redistribution layer 50.

In some embodiments, the inductor structure 10c may be disposed on a section of the redistribution layer 30. The inductor structure 10c may include one or more inductor units 10a or inductor units 10b shown in FIG. 1 or FIG. 2. In some embodiments, the inductor structure 10c may be electrically connected to the redistribution layer 30. In some embodiments, the inductor structure 10c may be electrically connected to the capacitor structure 20. For example, the inductor structure 10c may be electrically connected to the electrode 22 of the capacitor structure 20, or electrically connected to the electrode 21 of the capacitor structure 20.

In some embodiments, the conductive structure 100 of the inductor structure 10c may be disposed on the redistribution layer 30. In some embodiments, the conductive structure 100 of the inductor structure 10c may be in contact with the redistribution layer 30. In some embodiments, the magnetic element 110 is disposed at a level higher than that of the redistribution layer 30. In some embodiments, the conductive layer 1003 of the inductor structure 10c may be in contact with the redistribution layer 30.

In some embodiments, the redistribution layer 50 may be disposed over the conductive pillar 41 and the conductive pillar 42. The redistribution layer 50 may be electrically connected to the redistribution layer 30 through the conductive pillar 41. The redistribution layer 50 may be electrically connected to the redistribution layer 30 through the conductive pillar 42. The redistribution layer 50 may be electrically connected to the capacitor structure 20. The redistribution layer 50 may serve as pads allowing electrical access to the capacitor structure 20 and other active devices (not shown).

In some embodiments, the insulating material 60 may be disposed on the carrier 80. The insulating material 60 may enclose the capacitor structure 20, the redistribution layer 30 and the inductor structure 10c. The conductive pillar 41 or the conductive pillar 42 may penetrate the insulating material 60 and forming a through dielectric via. The insulating material 60 may include a dielectric material, such as oxide, nitride, oxynitride or other suitable materials. The insulating material 60 may include epoxy resin, a fiberglass-reinforced epoxy resin, an epoxy resin with inorganic fillers, a ceramic material, or a polymer material such as polyimide.

When a power is applied to the circuit structure 1a, current may be generated and flow through the conductive pillar 41, the conductive pillar 42, and the conductive structure 100, and a greater magnetic flux can be generated with the aid of the inductor structure 10c, compared to the conventional 2.5D/3D redistribution layer stacking inductor structure. In this embodiment, the inductor structure 10c may include magnetic element, such as the magnetic element 110, enclosed by the conductive structure 100. In a conventional circuit structure, which includes two metal layers and a conductive pillar therebetween to form a conductive coil, the process for forming said conductive coil is complicated and is prone to break or collapse. In comparison with the conventional circuit structure, the circuit structure 1a has a relatively greater inductance and a higher production yield because the inductor structure 10c is pre-manufactured and can be integrated into the circuit structure 1a without performing complex conductive pillar formation in constituting the conductive coil of the conventional inductor structure.

Figure 4:
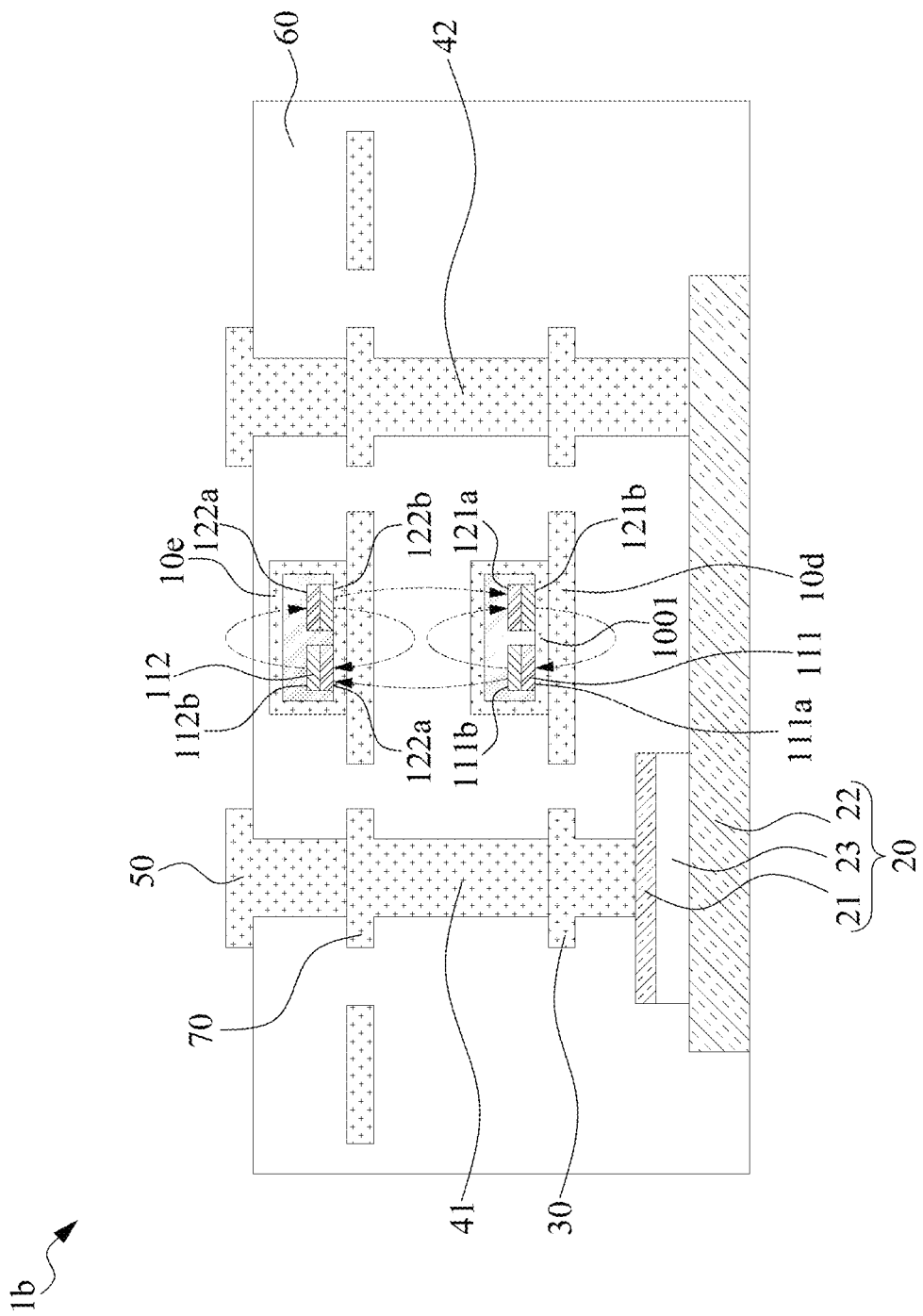
FIG. 4 is a cross-sectional view of a circuit structure in accordance with some embodiments of the present disclosure.

FIG. 4 is a cross-sectional view of a circuit structure 1b in accordance with some embodiments of the present disclosure. The circuit structure 1b of FIG. 4 has a structure similar to that of the circuit structure 1a of FIG. 1, and one of differences is that the circuit structure 1b includes an extra redistribution layer 70.

The redistribution layer 70 may be disposed over the redistribution layer 30. The redistribution layer 70 may be electrically connected to the redistribution layer 30 through the conductive pillar 41 or the conductive pillar 42. The redistribution layer 70 may be disposed between the redistribution layer 30 and the redistribution layer 50.

In some embodiments, the circuit structure 1b may have an inductor structure 10d and an inductor structure 10e. The inductor structures 10d and 10e may respectively have a structure similar to or different from that of the inductor structure 10c. In some embodiments, the inductor structure 10d may be disposed on the redistribution layer 30. In some embodiments, the inductor structure 10e may be disposed on the redistribution layer 70. The inductor structure 10e is disposed over the inductor structure 10d. In some embodiments, the inductor structure 10d may be separated from the inductor structure 10e by the insulating material 60. In some embodiments, the inductor structure 10d may be disposed between the conductive pillar 41 and the conductive pillar 42. Although FIG. 4 shows that the inductor structure 10d is disposed on the level of the redistribution layer 30, the inductor structure 10d can be disposed in any level of the redistribution layer(s). For example, the inductor structure 10d can be disposed on the first redistribution layer, the second redistribution layer, or the top-most redistribution layer. In some embodiments, the inductor structure 10d can even be disposed on the level of the capacitor structure 20, as long as electrical connection can be formed between the active components and the passive components the circuit design desires.

In some embodiments, the inductor structures 10d may be magnetically coupled to the inductor structures 10e, thereby enhancing the inductance of the circuit structure 1b. Arrows shown in FIG. 4 may indicate the interaction between the inductor structures 10d and 10e. For example, the magnetic pole 111b of the magnetic element 111 may be magnetically coupled to the magnetic pole 112a of the magnetic element 112; the magnetic pole 111b of the magnetic element 111 may be magnetically coupled to the magnetic pole 121a of the magnetic element 121; the magnetic pole 112b of the magnetic element 112 may be magnetically coupled to the magnetic pole 122a of the magnetic element 122; the magnetic pole 122b of the magnetic element 122 may be magnetically coupled to the magnetic pole 121a of the magnetic element 121.

Figure 5:
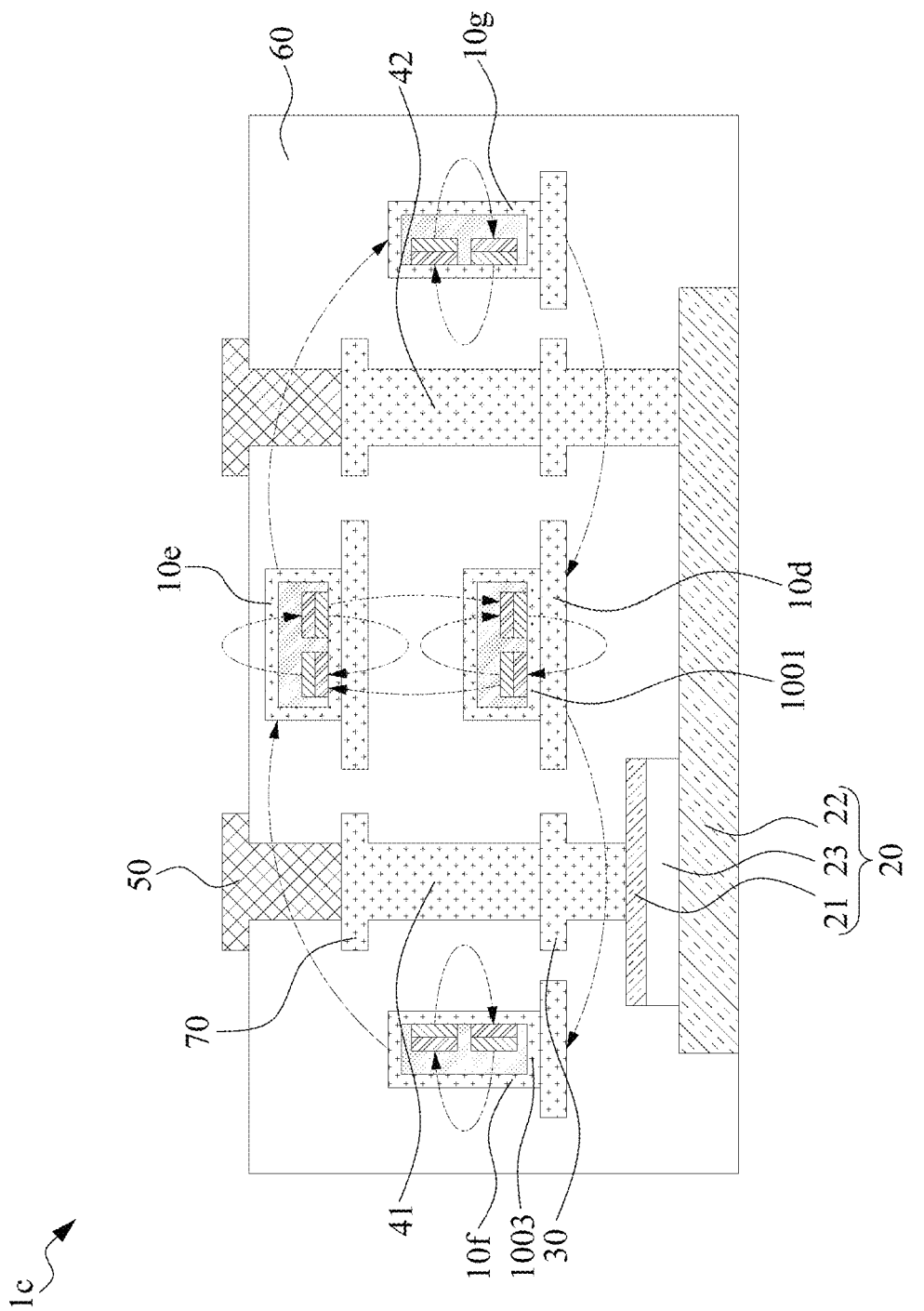
FIG. 5 is a cross-sectional view of a circuit structure in accordance with some embodiments of the present disclosure.

FIG. 5 is a cross-sectional view of a circuit structure 1c in accordance with some embodiments of the present disclosure. The circuit structure 1c of FIG. 5 has a structure similar to that of the circuit structure 1b of FIG. 4 except that the circuit structure 1c further includes an inductor structure 10f and an inductor structure 10g.

The inductor structures 10f and/or 10g may respectively have a structure the same as or similar to or different form that of the inductor structure 10c. In some embodiments, the inductor structure 10f and the inductor structure 10e may be disposed on the redistribution layer 30 and on two opposite sides of the inductor structure 10d. For example, the inductor structure 10f may be adjacent to the conductive pillar 41, and the inductor structure 10g may be adjacent to the conductive pillar 42.

In some embodiments, the inductor structures 10d, 10e, 10f and/or 10g may be magnetically coupled to each other, thereby enhancing the inductance generated of the circuit structure 1b. Arrow lines shown in FIG. 5 may indicate the interaction between two of inductor structures 10d, 10e, 10f and/or 10g.

In some embodiments, the conductive layer 1001 of the conductive structure 100 of the 10d may be attached to the redistribution layer 30. In some embodiments, the conductive layer 1003 of the conductive structure 100 of the 10f may be attached to the redistribution layer 30.

Figure 6:
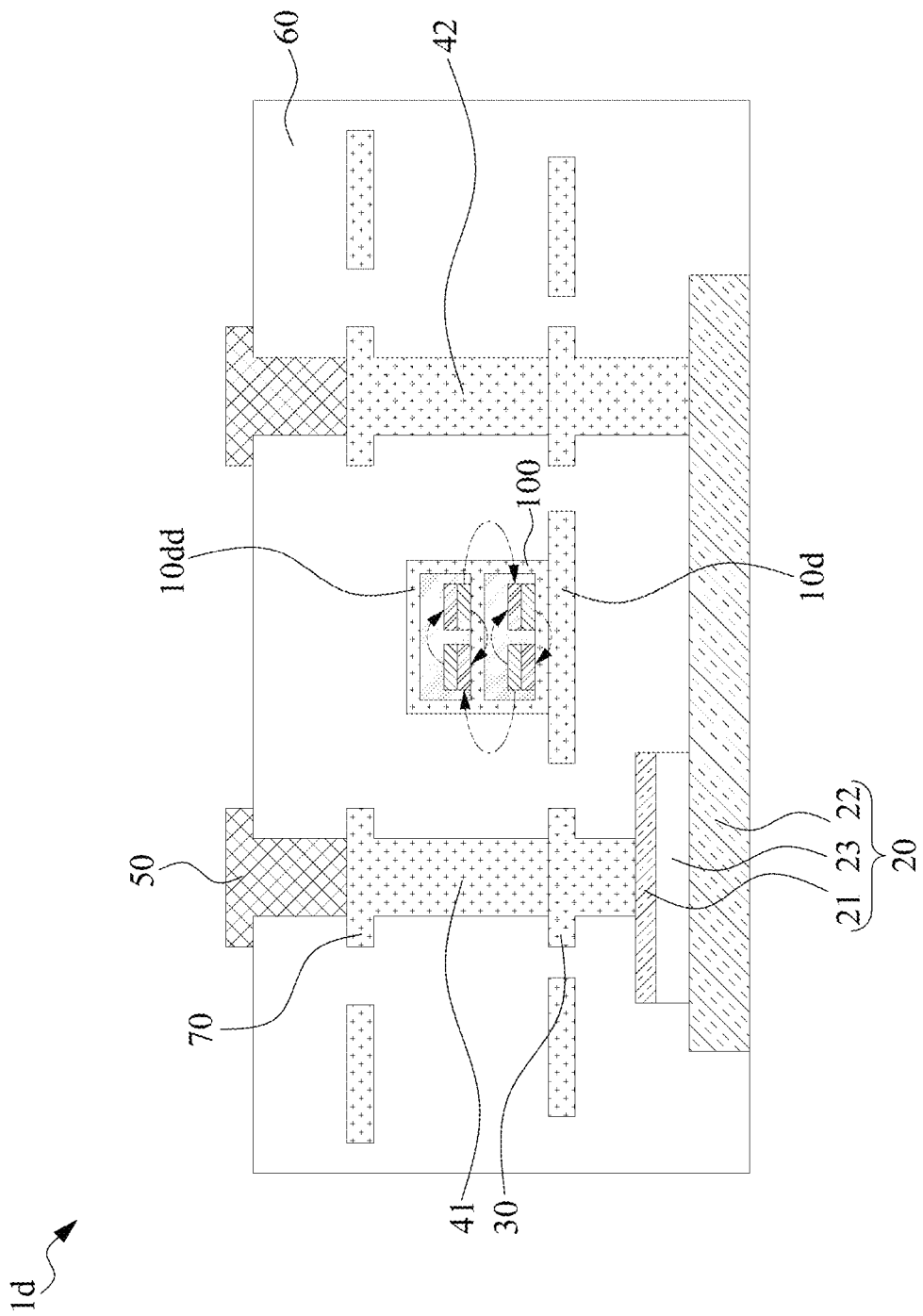
FIG. 6 is a cross-sectional view of a circuit structure in accordance with some embodiments of the present disclosure.

FIG. 6 is a cross-sectional view of a circuit structure 1d in accordance with some embodiments of the present disclosure. The circuit structure 1d of FIG. 4 has a structure similar to that of the circuit structure 1b of FIG. 4 except that the circuit structure 1d further includes an inductor structure 10dd.

In some embodiments, the inductor structure 10dd may be stacked on the inductor structure 10d. In some embodiments, the inductor structure 10dd and the inductor structure 10d may share a common conductive layer of the conductive structure 100. The conductive structure 100 of the inductor structure 10dd may be in contact with that of the inductor structure 10d. The inductor structure 10dd may be magnetically coupled to the inductor structure 10d. The inductor structure 10dd may have a greater magnetic interaction with the inductor structure 10d due to a less distance between inductor structure 10dd and inductor structure 10d.

Figure 7:
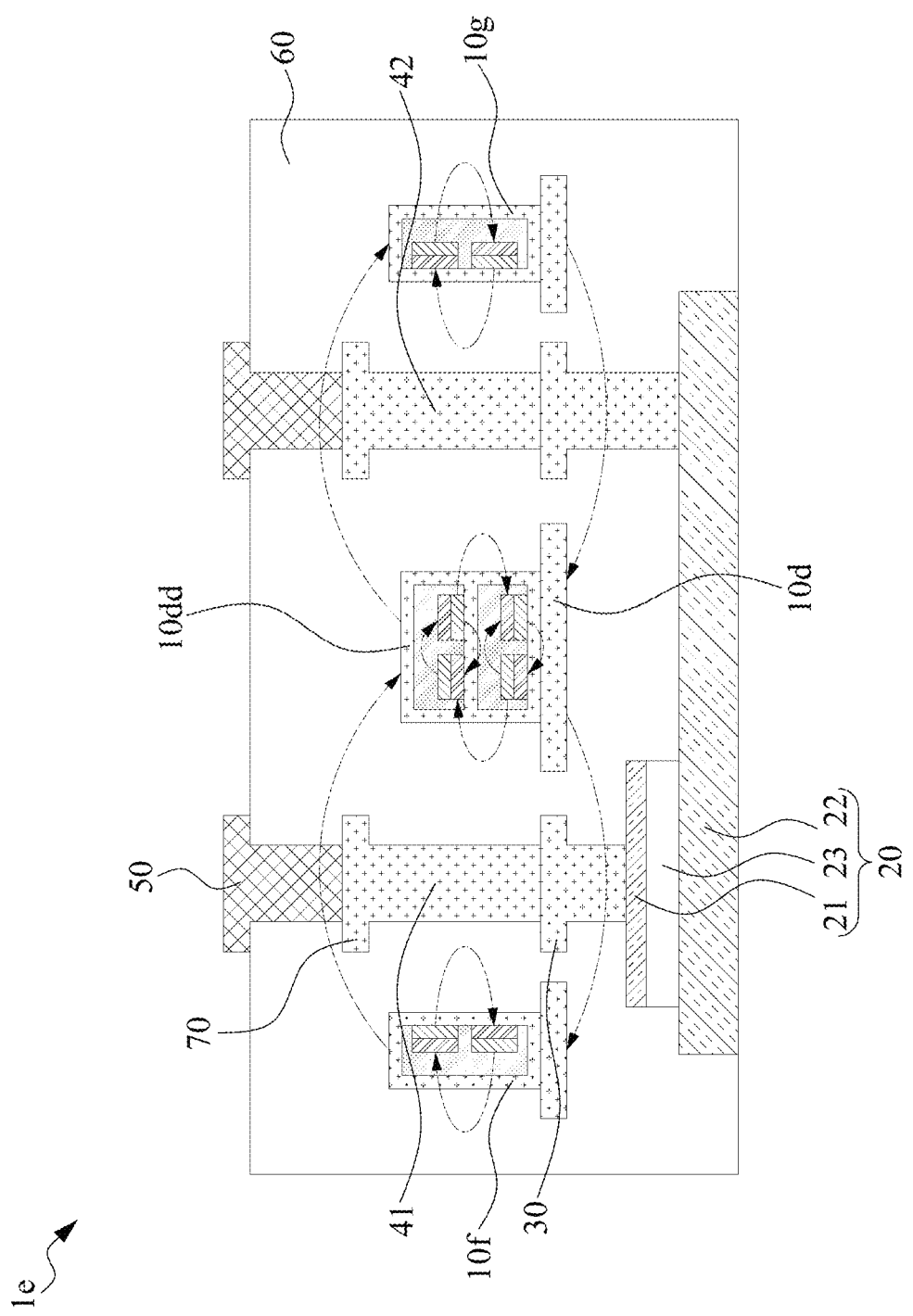
FIG. 7 is a cross-sectional view of a circuit structure in accordance with some embodiments of the present disclosure.

FIG. 7 is a cross-sectional view of a circuit structure 1e in accordance with some embodiments of the present disclosure. The circuit structure 1e of FIG. 7 has a structure similar to that of the circuit structure 1d of FIG. 6 except that the circuit structure further includes an inductor structure 10f and an inductor structure 10g.

In some embodiments, the inductor structure 10dd and the inductor structure 10d may serve a greater magnet, which may be magnetically coupled to the inductor structure 10f and the inductor structure 10g.

FIG. 8A, FIG. 8B, FIG. 8C, FIG. 8D, FIG. 8E and FIG. 8F illustrate various stages of a method for manufacturing an inductor unit 1a in accordance with some embodiments of the present disclosure.

Figure 8A:
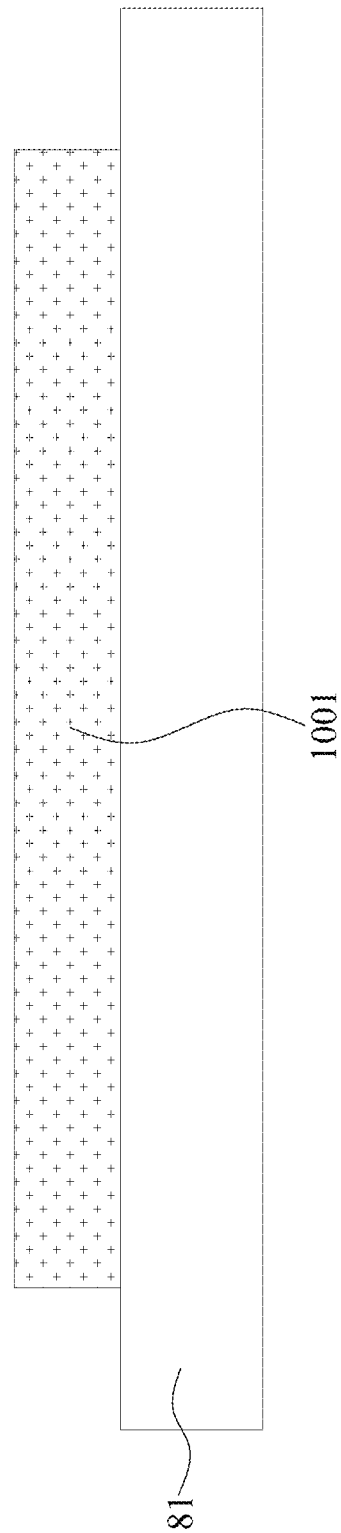
FIG. 8A, FIG. 8B, FIG. 8C, FIG. 8D, FIG. 8E and FIG. 8F illustrate various stages of a method for manufacturing an inductor unit in accordance with some embodiments of the present disclosure.

Referring to FIG. 8A, a carrier 81 is provided. The carrier 81 may include a semiconductor substrate, a ceramic substrate, a glass substrate, or other suitable substrates. The carrier 81 is configured to dispose the elements formed thereon and will be removed in subsequent process. In some embodiments, a conductive layer 1001 may be formed on the carrier 81. In some embodiments, a release layer can be formed over the carrier 81 prior to the formation of the conductive layer 1001.

Figure 8B:
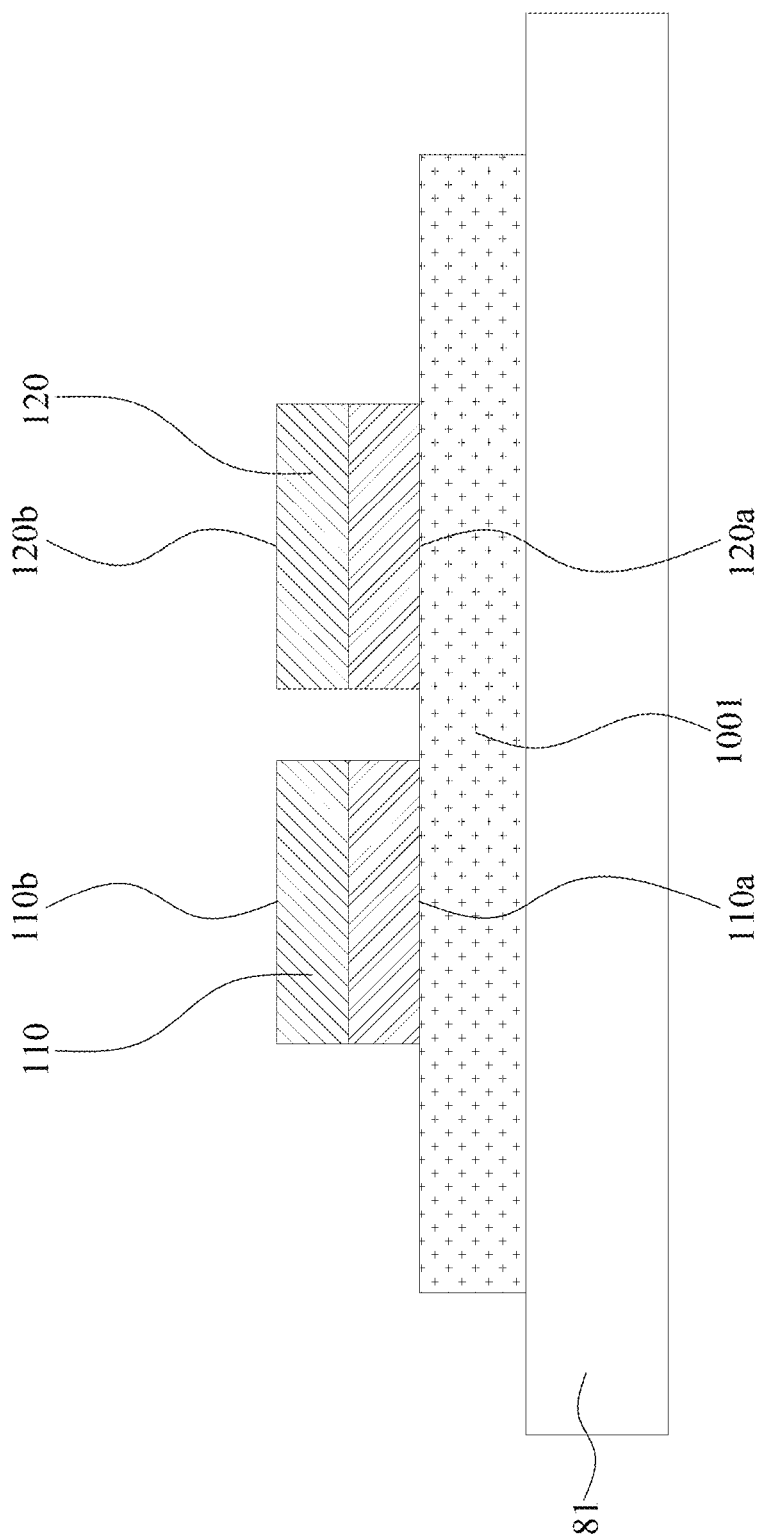

Referring to FIG. 8B, a magnetic element 110 and a magnetic element 120 are formed on the conductive layer 1001 with defined magnetic poles 110a, 110b, 120a, 120b. In some embodiments, the magnetic element 110 may be polarized before it is disposed on the conductive layer 1001. Alternatively, the magnetic element 120 may be polarized after it is disposed on the conductive layer 1001. Several approaches can be carried out to form the magnetic elements 110, 120. For example, a patterned photoresist layer can be formed over the conductive layer 1001. A sputtering operation can be performed to fill the openings in the patterned photoresist layer with magnetic materials. Subsequently, the patterned photoresist layer is removed, leaving the magnetic elements 110 and 120 on the conductive layer 1001 with desired pattern and polarities. For another example, a stud bump operation can be performed to form the magnetic elements 110, 120 at desired location of the conductive layer 1001.

Figure 8C:
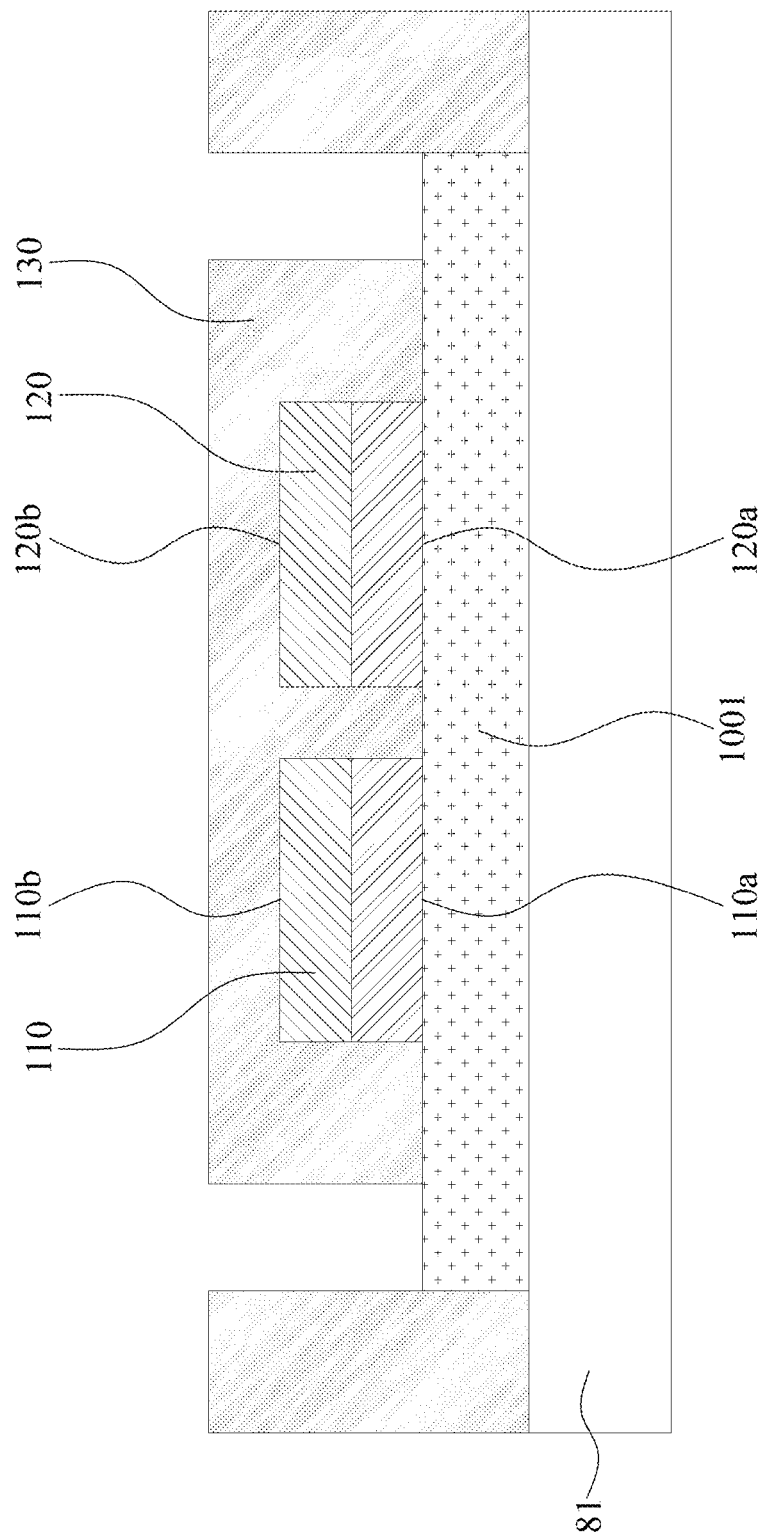

Referring to FIG. 8C, an insulating layer 130 may be formed on the carrier 81 and the conductive layer 1001 to enclose the magnetic element 110 and the magnetic element 120. The insulating layer 130 may be patterned to expose a portion of the conductive layer 1001. In some embodiments, the insulating layer 130 may be patterned by a lithography process to form openings exposing the conductive layer 1001.

Figure 8D:
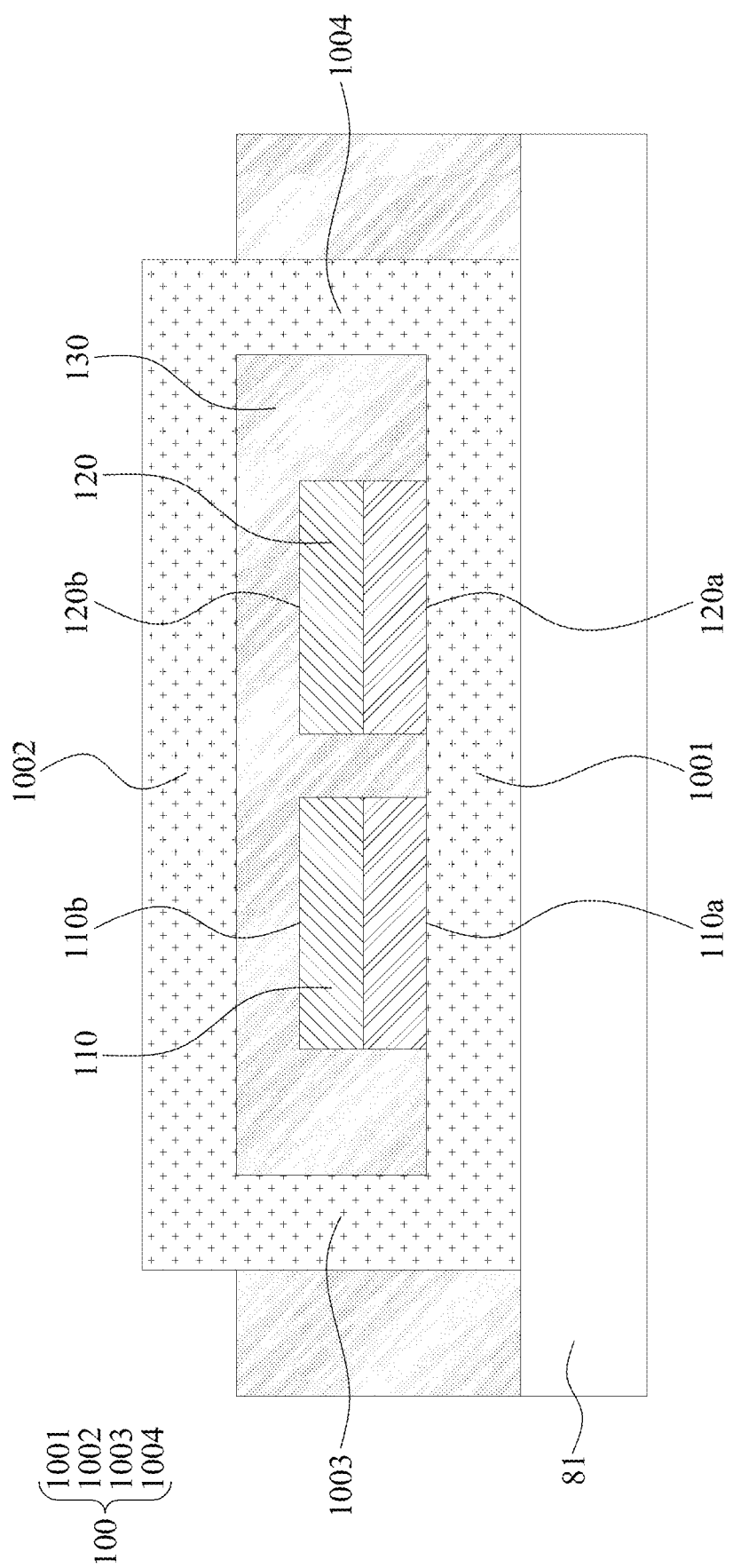

Referring to FIG. 8D, a conductive layer 1002, a conductive layer 1003 and a conductive layer 1004 are formed to form the conductive structure 100. The conductive layer 1003 and the conductive layer 1004 may fill the openings of the insulating layer 130. The conductive layer 1002 may cover the insulating layer 130 and extend from the conductive layer 1003 to the conductive layer 1004.

Figure 8E:
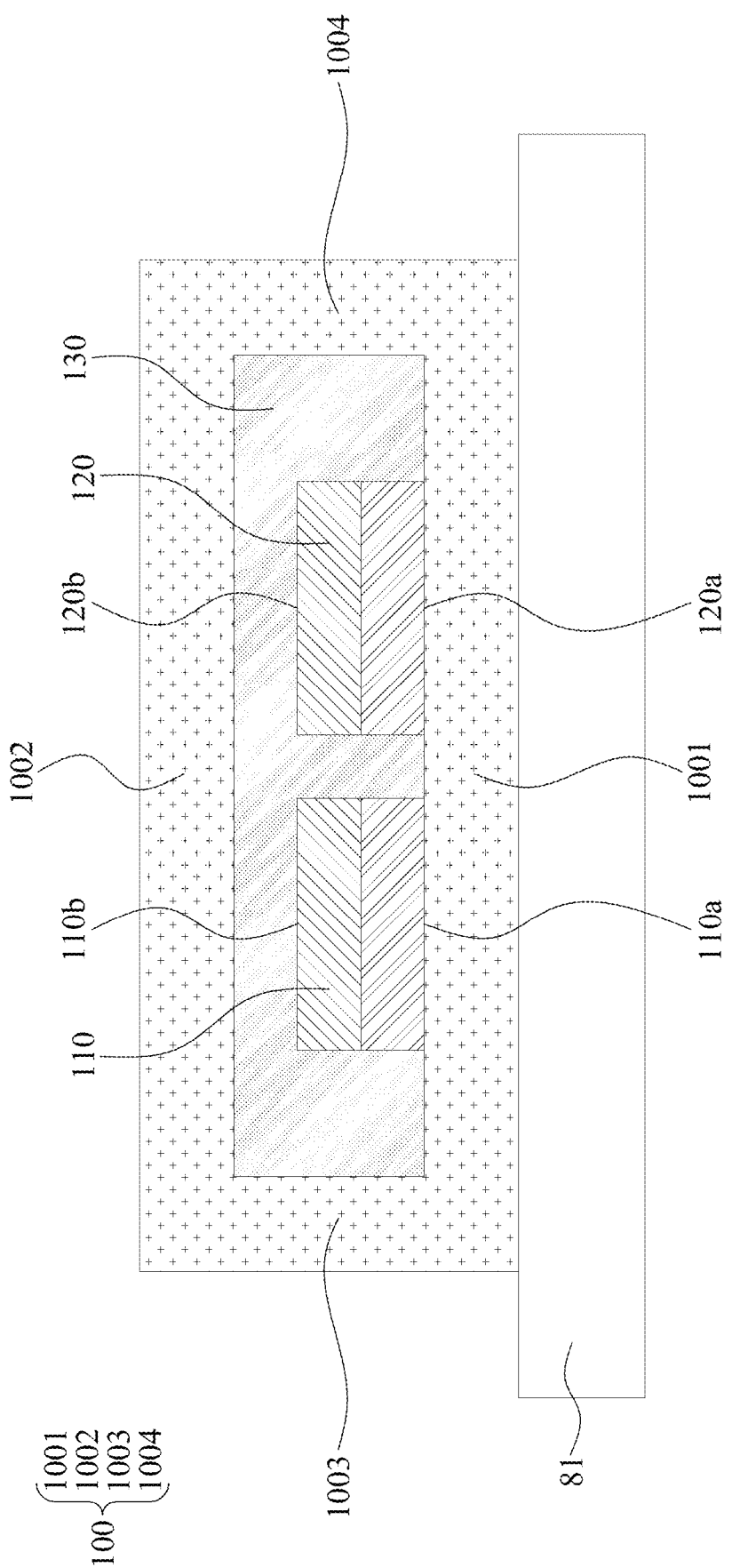

Referring to FIG. 8E, a portion of the insulating layer 130 is removed. In some embodiments, the portion of the insulating layer 130, not enclosed by the conductive structure 100, is removed.

Figure 8F:
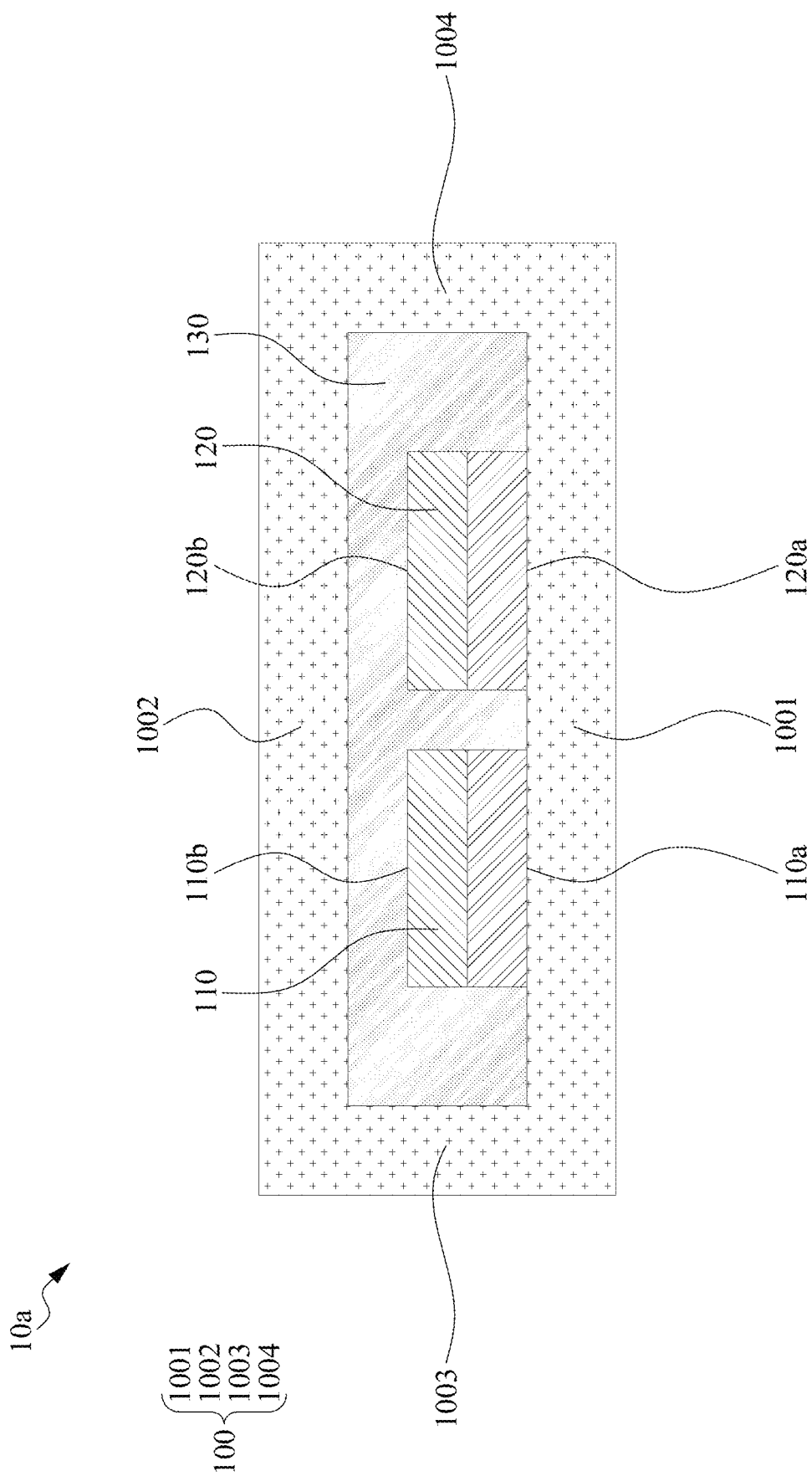

Referring to FIG. 8F, the carrier 81 is removed, and the inductor unit 10a is produced. In some other embodiments, additional magnetic elements may be disposed on and in contact with the conductive layer 1002, and additional conductive layers maybe formed to enclose the additional magnetic elements, thereby forming a pre-formed stacked inductor structure.

FIG. 9A, FIG. 9B, FIG. 9C, FIG. 9D, FIG. 9E and FIG. 9F illustrate various stages of a method for manufacturing a circuit structure 1a in accordance with some embodiments of the present disclosure.

Referring to FIG. 9A, a carrier 80 is provided. The capacitor structure 20 may be attached to the carrier 80. In some embodiments, a pre-formed capacitor structure 20 is attached to the carrier 80.

Figure 9B:
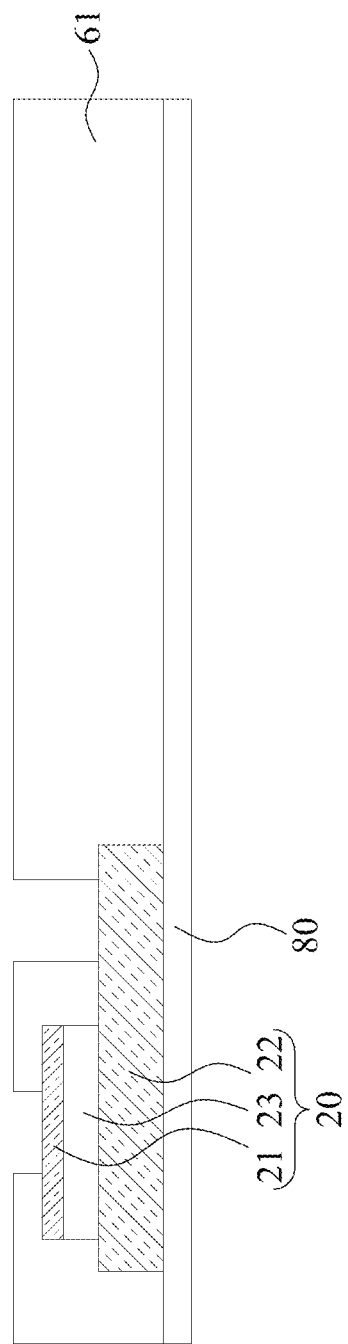

Referring to FIG. 9B, an insulating material 61 may be formed on the carrier 80. The insulating material 61 may be patterned to expose a portion of the electrode 21 and the electrode 22.

Figure 9C:
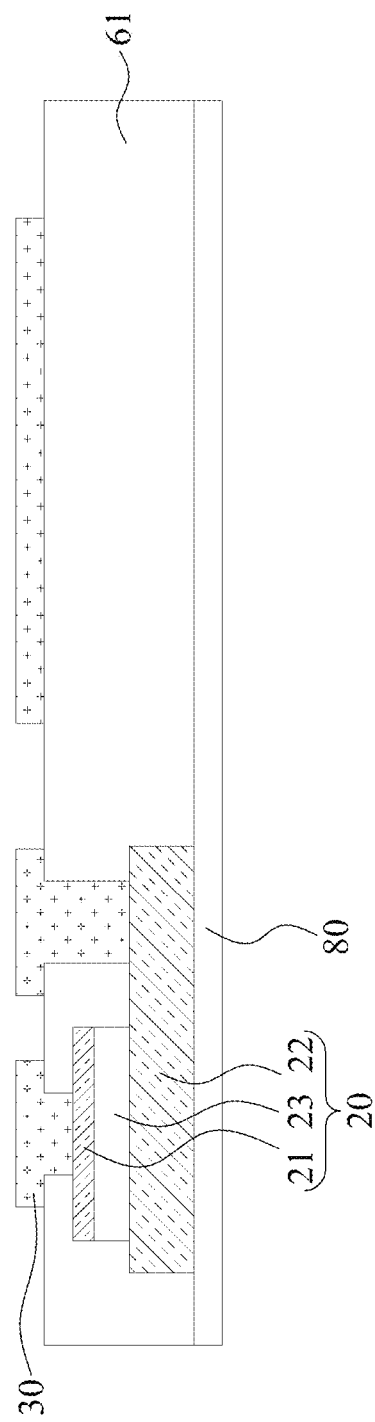

Referring to FIG. 9C, a redistribution layer 30 may be formed on the insulating material 61. The redistribution layer 30 may fill openings defined by the insulating material 61, and be electrically connected to the electrode 21 and the electrode 22 of the capacitor structure 20.

Figure 9D:
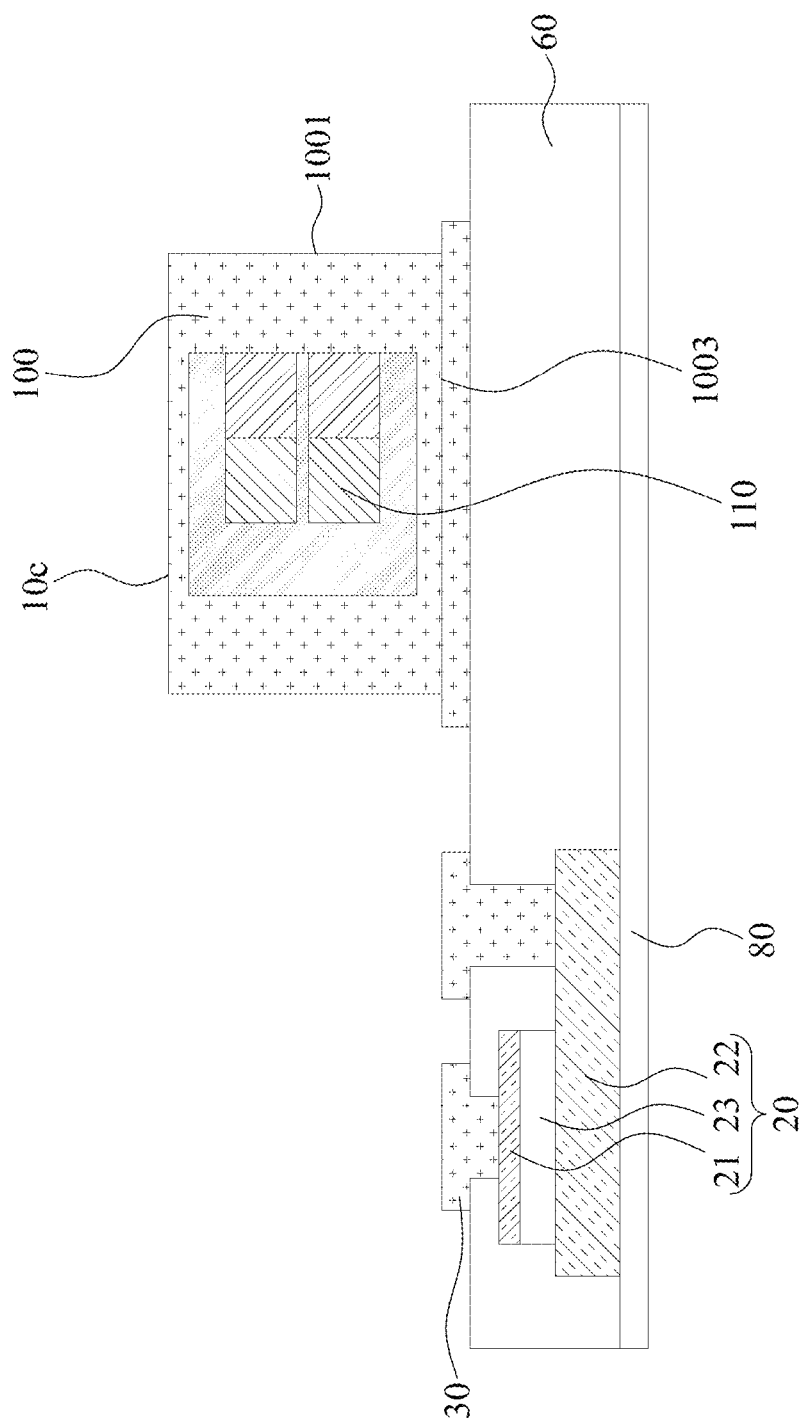

Referring to FIG. 9D, a pre-formed inductor structure 10c is disposed on the redistribution layer 30 via, for example, a metal bonding operation. In some embodiments, the pre-formed inductor structure 10c can be a single or a stack of inductor units previously described. In some embodiments, the inductor structure 10c is bonded to the redistribution layer 30 by a metal to metal bonding. Since the inductor structure 10c is a pre-formed structure, only one step is need to bond the conductive structure 100 of the inductor structure 10c to the redistribution layer 30, thereby simplifying the process for manufacturing the circuit structure 1a. In some other embodiments, a pre-formed stack of inductor units, such as the inductor structure 10dd and inductor structure 10, may be attached to the redistribution layer 30.

In this embodiment, the conductive layer 1003 of the inductor structure 10c is bonded to the redistribution layer 30. In some other embodiments, the conductive layer 1001 of the inductor structure 10c may be bonded to the redistribution layer 30.

Figure 9E:
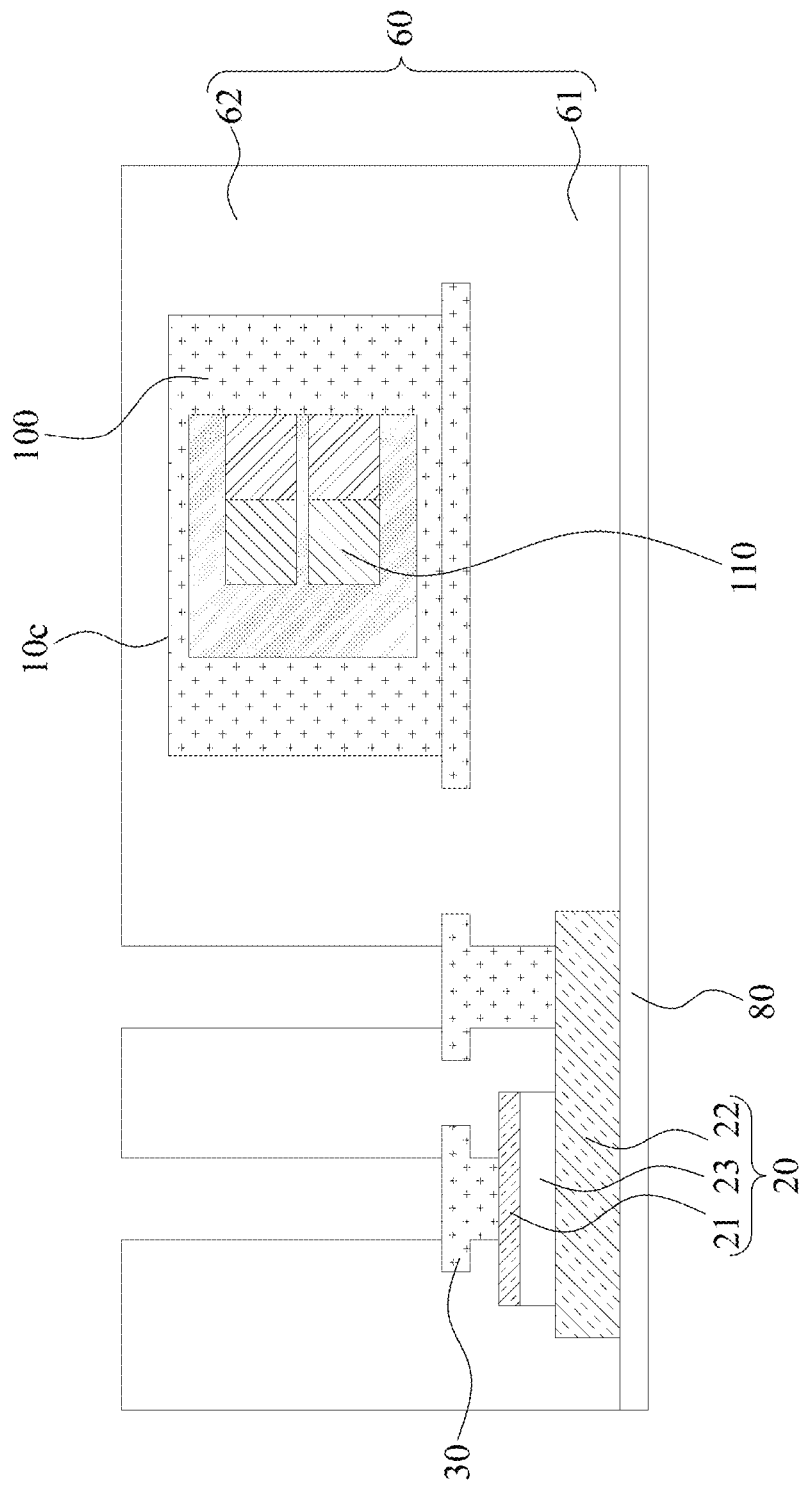

Referring to FIG. 9E, an insulating material 62, for example, low-k dielectric materials, may be formed on the insulating material 61 to enclose the insulating material 62. The insulating material 60 enclosing the inductor structure 10c can be formed by multiple insulating material depositions or formations along with the construction of the circuit structure. The insulating material 62 may be patterned to expose the redistribution layer 30.

Figure 9F:
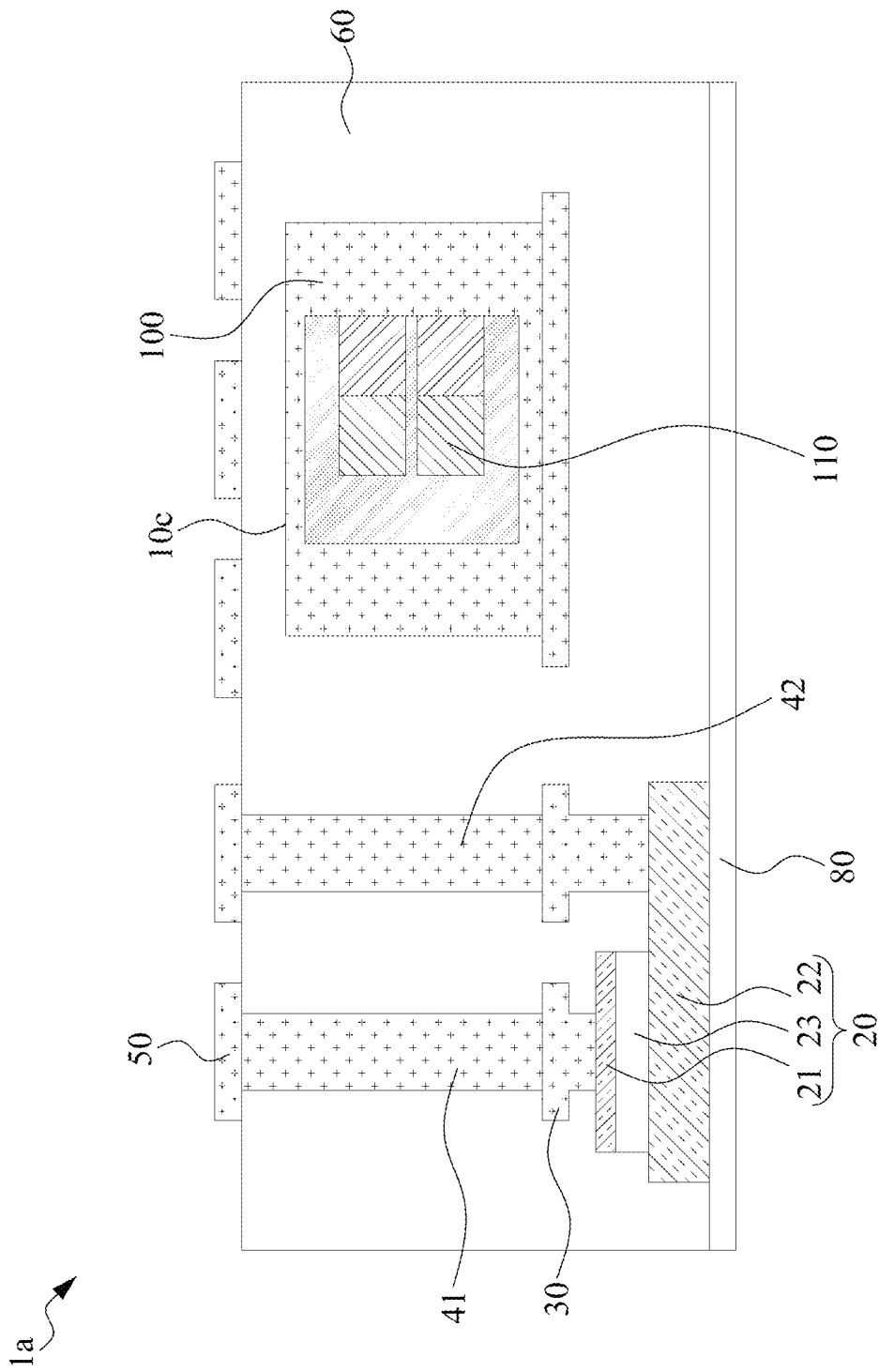

Referring to FIG. 9F, a conductive pillar 41, a conductive pillar 42, and a redistribution layer 50 are formed by suitable trench filling and metal line patterning operations, thereby producing the circuit structure 1a described in FIG. 3.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no exceeding 5 μm, no exceeding 2 μm, no exceeding 1 μm, or no exceeding 0.5 μm. A surface can be deemed to be substantially flat if a displacement between the highest point and the lowest point of the surface is no exceeding 5 μm, no exceeding 2 μm, no exceeding 1 μm, or no exceeding 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An inductor unit, comprising:
a conductive structure having a bottom conductive layer, a top conductive layer, and a first side conductive layer extending from the bottom conductive layer to the top conductive layer;
a first magnetic element disposed on the bottom conductive layer of the conductive structure; and
an insulating layer disposed on the bottom conductive layer of the conductive structure,
wherein the insulating layer covers and surrounds the first magnetic element, wherein the first magnetic element is in contact with the bottom conductive layer of the conductive structure.

2. The inductor unit of claim 1, wherein the first magnetic element is spaced apart from the top conductive layer of the conductive structure by the insulating layer.

3. The inductor unit of claim 1, wherein the first magnetic element is spaced apart from the first side conductive layer of the conductive structure by the insulating layer.

4. The inductor unit of claim 1, wherein the conductive structure further comprises a second side conductive layer opposite to the first side conductive layer and extending from the bottom conductive layer to the top conductive layer.

5. The inductor unit of claim 4, wherein the bottom conductive layer, the top conductive layer, the first side conductive layer and the second side conductive layer encloses the first magnetic element.

6. The inductor unit of claim 4, wherein the first magnetic element is free of enclosure at a third side of the conductive structure, wherein the third side is between the first side conductive layer and the second side conductive layer.

7. The inductor unit of claim 1, further comprising:
a second magnetic element disposed on the bottom conductive layer of the conductive structure, wherein the first magnetic element is spaced apart from the second magnetic element by the insulating layer.

8. A circuit structure, comprising:
a capacitor structure;
a first redistribution layer over the capacitor structure;
a first inductor structure electrically connected to the first redistribution layer;
an insulating material enclosing the first redistribution layer, the first inductor structure and the capacitor structure;
a second redistribution layer over the first inductor and the capacitor structure; and
a first conductive pillar penetrating the insulating material and electrically connecting to the first redistribution layer, the second redistribution layer and the capacitor structure,
wherein the first inductor structure comprises two or more inductor units, each of the two or more inductor units comprises:
a conductive structure having a bottom conductive layer;
a first magnetic element disposed on the bottom conductive layer of the conductive structure; and
an insulating layer disposed on the bottom conductive layer of the conductive structure, wherein the insulating layer covers and surrounds the first magnetic element, a bottom surface of the first magnetic element has an elevation higher than an upper surface of the first redistribution layer.

9. The circuit structure of claim 8, wherein a first inductor unit comprises a second magnetic element disposed on the bottom conductive layer of the conductive structure and spaced apart from the first magnetic element by the insulating layer.

10. The circuit structure of claim 8, wherein the conductive structure of the two or more inductor units is in contact with the first redistribution layer.

11. The circuit structure of claim 8, further comprising:
a second inductor structure disposed over the second redistribution layer and magnetically coupled to the first inductor structure.

12. The circuit structure of claim 10, further comprising:
a second conductive pillar penetrating the insulating material and electrically connecting the first redistribution layer and the second redistribution layer, wherein the first conductive pillar is electrically connected to a first electrode of the capacitor structure, and the second conductive pillar is electrically connected to a second electrode of the capacitor structure.

13. A method for manufacturing a circuit structure, comprising:
forming a capacitor structure;
forming a first redistribution layer on the capacitor structure;
forming a first inductor structure on the first redistribution layer;
forming a second redistribution layer over the first inductor structure, wherein forming the first inductor structure comprises:
disposing a first inductor unit on the first redistribution layer; and
disposing a second inductor unit on the first redistribution layer and spaced apart from the first inductor unit; and
forming the first inductor unit, comprising:
providing a bottom conductive layer;
forming a first magnetic element on the bottom conductive layer;
patterning a dielectric layer covering the first magnetic element to obtain an opening;
forming a side conductive layer by filling the opening in the dielectric layer; and
forming a top conductive layer over the side conductive layer and the dielectric layer.

14. The method of claim dielectric layer 13, wherein forming the first inductor structure on the first redistribution layer comprises:
disposing a pre-formed stack of inductor units on the first redistribution layer.

15. The method of claim 13, further comprising:
forming a second inductor structure on the second redistribution layer.

* * * * *